United States Patent
Cosemans et al.

(10) Patent No.: US 10,867,666 B2
(45) Date of Patent: Dec. 15, 2020

(54) MEMORY UNIT

(71) Applicant: SURECORE LIMITED, Leeds (GB)

(72) Inventors: Stefan Cosemans, Leeds (GB); Bram Rooseleer, Leeds (GB)

(73) Assignee: SURECORE LIMITED, Leeds (GB)

( * ) Notice: Subject to any disclaimer, the term of this patent is extended or adjusted under 35 U.S.C. 154(b) by 197 days.

(21) Appl. No.: 16/305,599

(22) PCT Filed: Jun. 2, 2017

(86) PCT No.: PCT/GB2017/051591
§ 371 (c)(1),
(2) Date: Nov. 29, 2018

(87) PCT Pub. No.: WO2017/208014
PCT Pub. Date: Dec. 7, 2017

(65) Prior Publication Data
US 2020/0327931 A1    Oct. 15, 2020

(30) Foreign Application Priority Data

Jun. 3, 2016  (GB) .................................. 1609703.2

(51) Int. Cl.
*G11C 5/14* (2006.01)
*G11C 11/418* (2006.01)
*G11C 11/419* (2006.01)

(52) U.S. Cl.
CPC .......... *G11C 11/418* (2013.01); *G11C 11/419* (2013.01)

(58) Field of Classification Search
CPC ..................................................... G11C 11/418
USPC .......................................................... 365/154
See application file for complete search history.

(56) References Cited

U.S. PATENT DOCUMENTS

| 7,158,436 B2 * | 1/2007 | Lee .......................... G11C 5/14 |
| | | 365/189.06 |
| 2006/0120178 A1 | 6/2006 | Lee |
| 2009/0257278 A1 | 10/2009 | Hahn |
| 2010/0165733 A1 | 7/2010 | Nakamura et al. |
| 2014/0016400 A1 | 1/2014 | Pelley et al. |

OTHER PUBLICATIONS

International Search Report and Written Opinion dated Sep. 1, 2017, from International Application No. PCT/GB2017/051591, 11 pages.
International Preliminary Report on Patentability dated Sep. 6, 2018, from International Application No. PCT/GB2017/051591, 18 pages.

* cited by examiner

*Primary Examiner* — Xiaochun L Chen
(74) *Attorney, Agent, or Firm* — Meunier Carlin & Curfman LLC (57) ABSTRACT

There is provided a memory unit comprising an array of memory cells and a driver circuit configured to output an output address signal that addresses a portion/subset of the array of memory cells. The driver circuit comprises a logic gate that is configured to receive one or more input address signals and to provide an output address signal in dependence upon the one or more input address signals, and wherein the logic gate is configured to output a drive voltage provided by a first of the one or more input address signals as the output address signal when the output of the logic gate is true/high.

21 Claims, 8 Drawing Sheets

MEMORY UNIT

TECHNICAL FIELD

The present invention relates to a memory unit providing digital data storage. In particular, the present invention provides an improved memory unit and method for implementing word line boost that addresses the challenge of applying this boost in an effective way.

BACKGROUND

Data storage is an essential requirement for virtually all modern digital electronic systems. Static read/write memory (SRAM) comprises a major part of that function, being relatively easy to integrate into a semiconductor device together with large amounts of logic, thus offering fast access and low power. With the advent of deep sub-micron (DSM) geometry silicon processing, the task of implementing reliable storage whilst simultaneously maintaining low power consumption becomes increasingly problematic, whilst conversely demand rises with the proliferation of battery-powered electronic gadgets requiring progressively larger memories.

Figure 1:
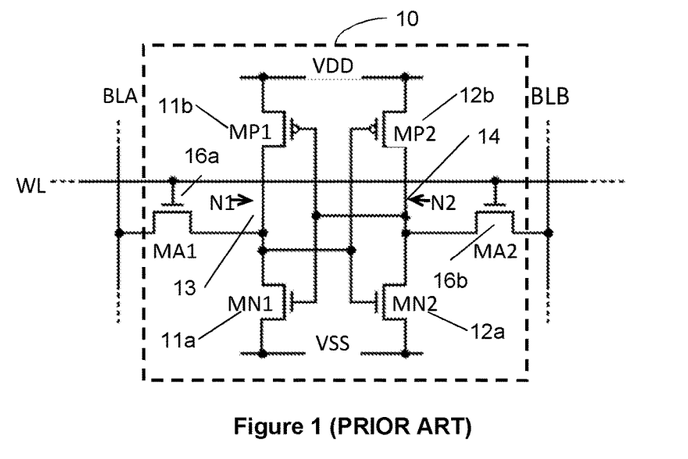
FIG. 1 illustrates a standard 6-transistor memory cell.

The most commonly-used design of SRAM memory cell is the 6-transistor circuit shown in FIG. 1 and consists of a storage element made up of two back-to-back/cross-coupled inverters ([MN1, MP1] and [MN2, MP2]) 11a, 11b, 12a, 12b with access transistors (MA1 and MA2) 16a, 16b which are turned ON by means of a word line control (WL) to form a conducting path between the data storage nodes (N1 and N2) 13, 14 of the cell and the complementary bit lines (BLA and BLB).

A write operation, in which a data value is written to a memory cell, is achieved by forcing a high voltage onto one of BLA or BLB whilst simultaneously forcing a low voltage onto the other, and then driving the word line (VVL) high to activate the access path allowing the voltage levels held on the bit lines (BLA and BLB) to overcome the state of the storage element. The word line is then driven low to disconnect the memory cell with its data store held in its new state.

A read operation, in which a data value stored in a memory cell is read, is achieved by initially driving both bit lines to a notionally high voltage level before then driving the word line (VVL) high. One of either BLA or BLB will then be pulled low through the access devices (MA1 and MA2) by the low voltage side of the storage element. The complementary bit lines are attached to inputs of a sense amplifier (not shown) that is part of the read circuitry which is used when data is read from the memory. A sense amplifier senses the low level signals present on the bit lines which represent the data value (i.e. either a '1' or a '0') stored in a given memory cell, and amplifies the small voltage swing to recognisable logic level so that the data can be interpreted properly by logic outside the memory. The difference in voltage levels between the two bit lines can therefore be sensed by the sense amplifier and used to determine the data value (i.e. '1' or '0'). The decision levels representing a '1' and a '0' will have been pre-determined during the circuit design phase and applied by the sense amplifier.

Figure 2:
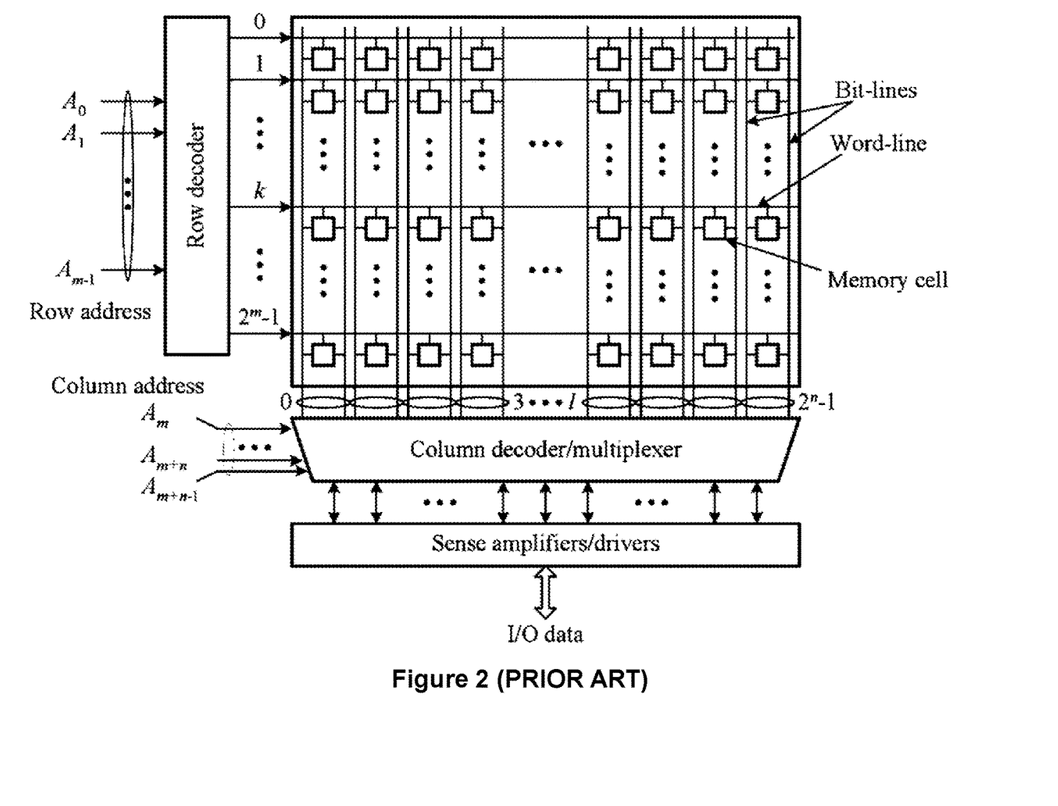
FIG. 2 illustrates an example of a conventional array of memory cells.

FIG. 2 illustrates a conventional memory unit wherein the memory cells are arranged in a two-dimensional array consisting of horizontal rows and vertical columns. Each memory cell in the array is connected to a word line that runs horizontally across a row of the array and to a pair of bit lines that run vertically within the columns. By convention the word lines are always said to run along the rows of an array of memory cells whilst the bit lines are always said to run down the columns of an array of memory cells, irrespective of the orientation of the array. The word lines are driven by a row decoder that takes an m-bit address and produces $2^m$ word line enable signals. Each pair of bit lines is then driven by a column decoder that takes an n-bit address and produces $2^n$ bit line signals.

In order to reduce delay and power dissipation, a number of different partitioning approaches have been used in which the memory array is partitioned into a number of smaller blocks that can be separately accessed. In particular, it is common for a memory array to be partitioned by the use of divided/hierarchical word lines and divided/hierarchical bit lines.

In a hierarchical word line arrangement, instead of a single word line that runs the complete width of a row of memory cells and connects to each cell in the row, a multi-level structure is used. Effectively, a single word line is broken up into multiple "local word lines", each of which connects to a group of memory cells in a part of a row of the array. A "global word line" then runs the width of the row and is connected to each of the local word lines in that column via gates/switches.

Similarly, in a hierarchical bit line arrangement in which, instead of a single bit line that runs the complete height of a column of memory cells and connects to each cell in the column, another multi-level structure is used. Effectively, a single bit line is broken up into multiple "local bit lines", each of which connects to a group of memory cells in a part of a column of the array. A "global bit line" also runs the height of the column, and is connected to each of the local bit lines in that column via an interface circuit. The memory read and write circuits connect to the global bit line, and not directly to the local bit line. During a memory access, only a local bit line in the relevant part of the column is connected to the global bit line.

Figure 3:
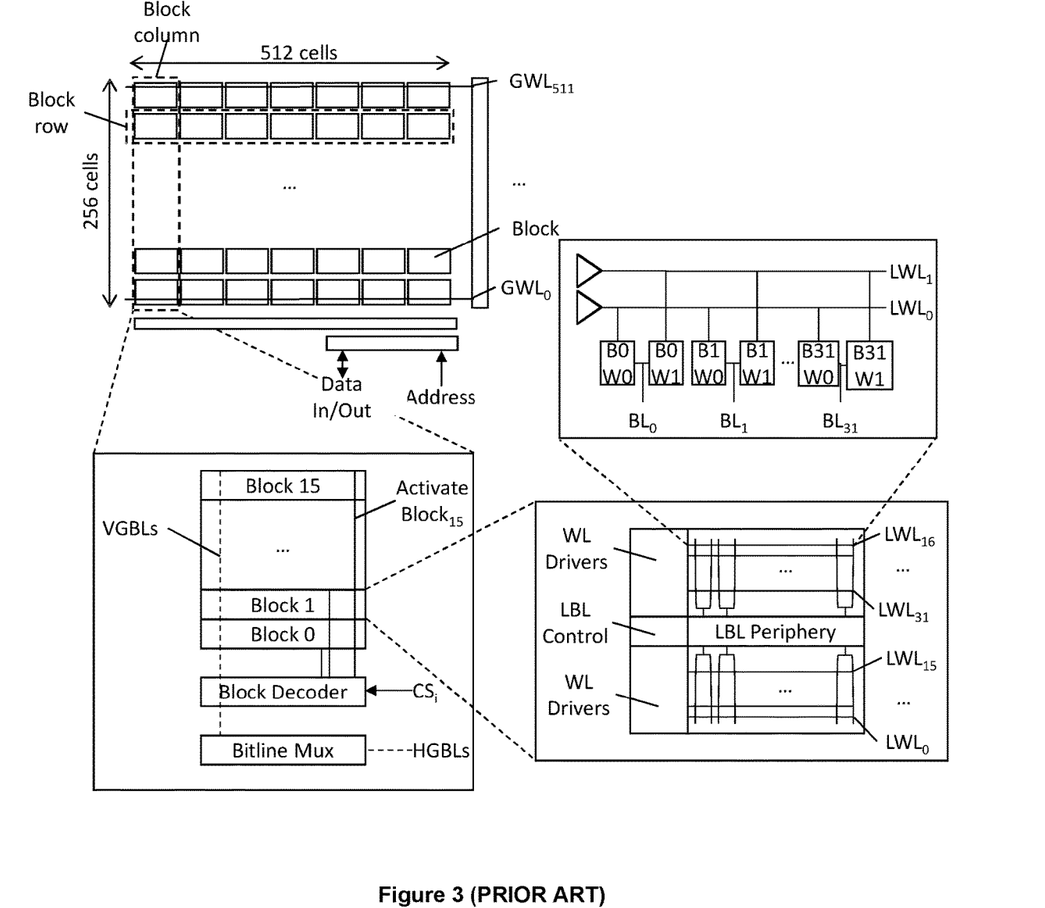
FIG. 3 illustrates schematically an example of a partitioned array of memory cells.

FIG. 3 illustrates schematically an example of a partitioned array of memory cells. In this particular example, the array is comprised of 256 rows of cells and 512 columns of cells with the array being partitioned into a number of local 'blocks'. At the top level the array is subdivided into 8 columns (Block Columns) by 16 rows (Block Rows) of these local Blocks. Each Block therefore comprises 16 rows with 64 cells in each row. Each of the 16 rows comprise interleaved cells such that each row has two separate words of 32 cells, and each row therefore has two separate local word lines (LWL) (i.e. one for each word, giving 32 LWLs per block). Each of the 64 columns in the Block also has its own local bit lines (LBL).

Figure 4:
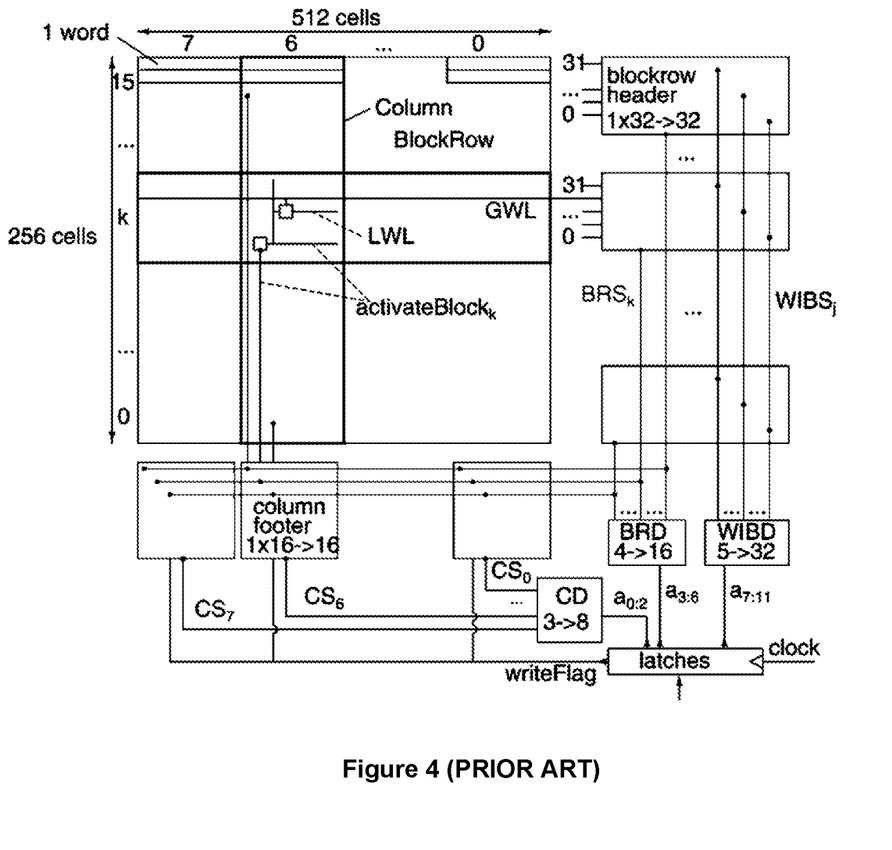
FIG. 4 illustrates schematically an example of the decoder organisation for the partitioned array of FIG. 3.

FIG. 4 then illustrates schematically an example of a decoder organisation for the partitioned array of FIG. 3. In this three-stage decoder three first-level decoders are used to decode the 12 address bits (0:11) into three sets of one-hot output wires. The column decoder (CD) decodes three address bits (0:2) to generate one of 8 Column Select (CS) signals. The block row decoder (BRD) decodes 4 address bits (3:6) to generate one of 16 Block Row Select (BRS) signals. The within block decoder (WIBD) decodes the remaining 5 address bits (7:11) to generate one of 32 Within Block Select (WIBS) signals. A Column Select (CS) signal identifies which of the Block Columns of the array is selected/identified by the address. A Block Row Select (BRS) signal identifies which of the Block Rows of the array is selected/identified by the address. A Within Block Select (WIBS) signal indicates which word within the selected Block Row should be enabled (32 words, 2 for each of 16 rows).

There are then two groups of second-level decoders. In the column footers, the 16 BRS signals are combined with the column select (CS) signal to generate the activateBlock signals, with each of these activateBlock signals being directed to a single block where it is used to control the block operation. In the block row headers, the 32 WIBS signals are combined with the BRS signals to generate the global word line (GWL) signals for this block row. The BRS signals are therefore used twice in this decoder—once to obtain the GWL signal and once to obtain the activateBlock signal. This results in a deeper logic depth but in a lower capacitive load and energy consumption. The last level decoder then combines the activateBlock signal with the GWL signal to activate a single LWL of the row within the Block.

Figure 5A:
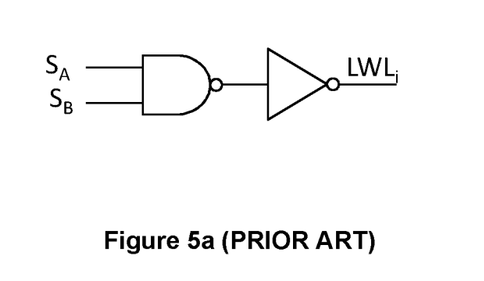
FIG. 5a illustrates schematically an example of a conventional driver circuit for use in a memory array.
Figure 5B:
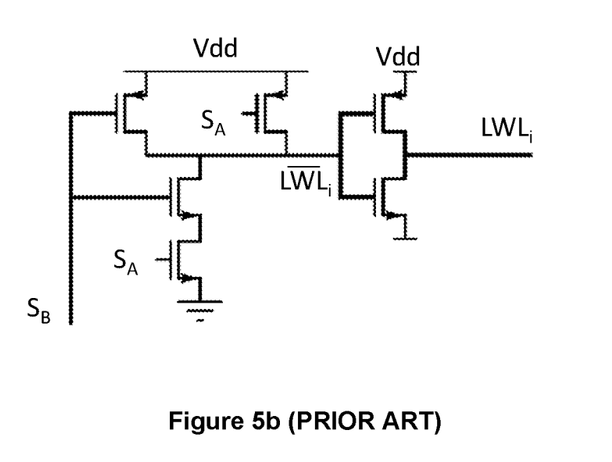
FIG. 5b illustrates an example of a CMOS driver circuit.

Typically, the last level decoder comprises a word line driver circuit that acts as the last combinational stage in the decoder organisation and buffers the signal towards the word line. FIG. 5a illustrates schematically an example of a conventional driver circuit for use in a memory array. This conventional driver circuit comprises a NAND gate and an inverter. The NAND gate combines two separate address signals that each address a different portion/subset of the array of memory cells to thereby generate the appropriate word line signal that is buffered by the inverter. FIG. 5b illustrates an example of a CMOS word line driver circuit that combines two input address signals ($S_A$ and $S_B$, which may be the GWL and activateBlock signal respectively) to generate the local word line signal (LWL).

As discussed briefly above, writing data into a memory cell is achieved by forcing a high voltage onto one of BLA or BLB whilst simultaneously forcing a low voltage onto the other, and then driving the word line (WL) high to activate the access path. The low voltage on one of the bit lines therefore needs to be conducted through the associated access transistor (MA1 or MA2) whilst fighting against the corresponding PMOS pull up device (MP1 or MP2). For small 6-transistor cells the sizes of all of the transistors is minimised, and advanced technologies now have PMOS devices of about the same strength as NMOS devices. It can therefore be difficult to ensure that the NMOS access transistor is able to overdrive the corresponding PMOS pull up device during a write operation. Consequently, some means of "write-assist" is now frequently employed in order to ensure reliable operation.

Figure 6A:
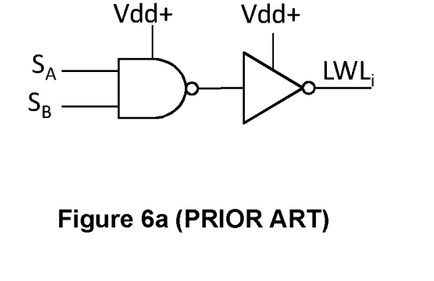
FIGS. 6a and 6b illustrate schematically examples of the use a conventional driver circuit for providing a boosted voltage.
Figure 6B:
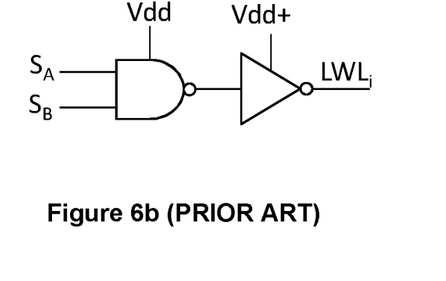

One common write-assist scheme is "word line (WL) boost", which involves increasing the drive voltage on the gate of the access transistors so that this is greater than the operational voltage (Vdd) provided to the memory unit by an external power supply. Using a word line boost can improve both the writeability and the read speed of cells, with the benefits of this scheme increasing significantly as the supply voltage is scaled down. FIGS. 6a and 6b illustrate schematically examples of the use a conventional driver circuit for providing a boosted voltage. In the example of FIG. 6a, word line boost is achieved by providing a boosted voltage (Vdd+) as the supply voltage for both the NAND gate and the inverter of a conventional word line driver circuit. In the example of FIG. 6b, word line boost is achieved by providing a boosted voltage (Vdd+) as the supply voltage for just the inverter of a conventional word line driver circuit.

The arrangement of FIG. 6b is most appropriate when the boosted voltage is provided in a pulsed manner. It has a lower parasitic load on the boosted voltage (Vdd+) as the NAND gates don't have to be boosted. However, this arrangement cannot be used when the boosted voltage (Vdd+) is a statically higher voltage (or when the boost level is very high). As the local word line (LWL) is at 0V during standby (as a consequence of the fact that the last decoder stage is an AND gate), the node between the NAND and inverter will be at the high output level of the NAND gate, which is the lower operational voltage (Vdd). This means that the Vgs of the PMOS transistor in the inverter is then Vg=Vdd, Vs=Vdd+, which causes an important increase in leakage current. The arrangement of FIG. 6a has a larger load on the boosted voltage (Vdd+) (so is less suited for pulsed Vdd+ operation), but does not suffer from huge static leakage when a static boosted voltage (Vdd+) is applied.

SUMMARY

The present inventors have developed an improved memory unit and method for implementing word line boost that addresses the challenge of applying this boost in an effective way through merging the word line decoding function and the boost function. This is achieved by applying a boost or assist voltage as one of the input signals to a driver circuit that provides a decoding function. Furthermore, the present inventors propose a special 1-stage 2-input driver circuit that can be used to implement this method of word line boost that optimises area, dynamic power, leakage and speed of access operations (i.e. read and write operations). In particular, in a preferred embodiment the driver circuit described herein requires only two transistors, which is significantly smaller than the conventional driver circuits that require six transistors (4 in the NAND gate, 2 in the inverter). This proposed implementation of the driver circuit also does not suffer from the increased static leakage, as we have a pulsed supply voltage.

Therefore, according to a first aspect, there is provided a memory unit. The memory unit comprises an array of memory cells and a driver circuit configured to output an output address signal that addresses a portion/subset of the array of memory cells. The driver circuit comprises a logic gate that is configured to receive one or more input address signals and to provide an output address signal in dependence upon the one or more input address signals, and wherein the logic gate is configured to output a drive voltage provided by a first of the one or more input address signals as the output address signal when the output of the logic gate is true/high.

The memory unit may further comprise a voltage control circuit configured to provide the drive voltage used for the first input address signal of the one or more input address signals, wherein the drive voltage provided by the voltage control circuit is equal to, greater than or less than a voltage provided to the memory unit by an external power supply. Preferably, the voltage control circuit comprises a control interface for receiving control signals (e.g. from an external control system) that defines a value for the drive voltage, the value defined by the control signal being equal to, greater than or less than a voltage provided to the memory unit by an external power supply.

The logic gate may comprise an inverter configured to receive the first input address signal as a supply voltage, to receive a second input address signal as an input, and to output the first input address signal in dependence upon the second input address signal. Preferably, the logic gate consists of the inverter.

The inverter may comprise one or more field effect transistors (FET) with the first input address signal being provided to a source of a first of the one or more field effect transistors. Preferably, the logic gate comprises a CMOS inverter that is configured to receive the first input address signal as a supply voltage, to receive the second address signal as an input, and to output the drive voltage provided by the first input address signal as the output address signal in dependence upon the second address signal. The logic gate may therefore comprises a PMOS transistor and an NMOS transistor, a source of the PMOS transistor being configured to receive the first input address signal, a gate of the PMOS transistor being connected to the second address signal, and a drain of the PMOS transistor being connected to an output of the driver circuit; and a source of the NMOS transistor being connected to ground/a negative supply voltage, a gate of the NMOS transistor being connected to the second address signal, and a drain of the NMOS transistor being connected to the output of the driver circuit.

The memory unit may further comprise an address decode circuit configured to decode an address (e.g. a plurality of address bits) and thereby generate one or more address signals (i.e. that each address a different portion/subset of the array of memory cells).

The one or more input address signals may each address any of a column of the array, a row of the array, a block of the array, a block column of the array, a block row of the array, and a global word line of the array. The output address signal may then address any of a column of the array, a row of the array, a block of the array, a block column of the array, a block row of the array, a global word line of the array and a local word line of the array.

The driver circuit may be configured to output the output address signal on to a word line of the array (i.e. is configured to operate as a word line driver). The memory cells may be grouped into a plurality of memory cell groups, a memory cell group being associated with a local word line that is operatively connected to a corresponding global word line via the driver circuit, the driver circuit being configured to receive a global word line signal as a second input address signal and to output the drive voltage provided by the first input address signals as the output address signal when the output of the logic gate is true/high.

The memory unit may further comprise a gate circuit configured to provide the first input address signal to the driver circuit, wherein the gate circuit comprises a further logic gate that is configured to receive an initial address signal and to output the first input address signal in dependence upon the initial address signal, and wherein the drive voltage is provided to the further logic gate as a supply voltage and is output as the first input address signal when the output of the further logic gate is true/high. The further logic gate may comprise a CMOS inverter that is configured to receive the drive voltage as a supply voltage, to receive the address signal as an input, and to output the drive voltage as the first input address signal in dependence upon the address signal. The logic gate may therefore comprise a PMOS transistor and an NMOS transistor, a source of the PMOS transistor being configured to receive the drive voltage, a gate of the PMOS transistor being connected to the address signal, and a drain of the PMOS transistor being connected to an output of the gate circuit; and a source of the NMOS transistor being connected to ground/a negative supply voltage, a gate of the NMOS transistor being connected to the address signal, and a drain of the NMOS transistor being connected to the output of the gate circuit.

The gate circuit may be configured to receive the drive voltage from the voltage control circuit as the supply voltage. The gate circuit may therefore be disposed between the voltage control circuit and the driver circuit. The gate circuit may then output the first input address signal to the driver circuit.

The memory unit may comprise a sequence of two or more driver circuits, wherein the output address signal produced by a preceding driver circuit is provided to an immediately subsequent driver circuit as the first input address signal. A first in the sequence of driver circuits may then be configured to receive a first input address signal from the gate circuit and to provide the output address signal to an immediately subsequent driver circuit in dependence upon a second input address signal provided as an input to the first driver circuit. A last in the sequence of driver circuits may then be configured to receive the output address signal from an immediately preceding driver circuit as a first input address signal and to provide a further output address signal in dependence upon a second input address signal provided as an input to the last driver circuit.

According to a second aspect there is provided a method of operating a memory unit comprising an array of memory cells. The method comprises providing one or more input address signals to a driver circuit, a first of the one or more input address signals providing a drive voltage, the driver circuit providing an output address signal in dependence upon the one or more input address signals, wherein the logic gate outputs the drive voltage provided by the first input address signal as the output address signal when the output of the logic gate is true/high.

The method may further comprise generating the drive voltage used for the first input address signal, wherein the drive voltage is equal to, greater than or less than a voltage provided to the memory unit by an external power supply. The method may then further comprise receiving a control signal that define a value for the drive voltage, the value defined by the control signal being equal to, greater than or less than a voltage provided to the memory unit by an external power supply. The control signals may be received from an external control system.

The drive voltage may be generated by a voltage control circuit, and preferably wherein the voltage control circuit comprises a control interface for receiving control signals that define a value for the drive voltage, the value defined by the control signal being equal to, greater than or less than a voltage provided to the memory unit by an external power supply.

The driver circuit may comprise a logic gate that is configured to receive the one or more input address signals and to provide an output address signal in dependence upon the one or more input address signals, and wherein the logic gate is configured to output the drive voltage provided by the first input address signals as the output address signal when the output of the logic gate is true/high.

According to a third aspect there is provided a method of operating a memory unit comprising an array of memory cells. The method comprises:
  at a voltage control circuit of the memory unit, receiving control signals that define an amount/value of a drive voltage that is equal to, greater than or less than a voltage provided to the memory unit by an external power supply;
  at the voltage control circuit of the memory unit, generating the drive voltage in accordance with the control signals and providing the drive voltage for use as a first input address signal; and
  at the driver circuit of the memory unit, receiving the first input address signal and one or more further input address signals, and providing an output address signal in dependence upon the input address signals;

wherein the driver circuit outputs the drive voltage provided by the first input address signal as the output address signal when the output of the logic gate is true/high.

BRIEF DESCRIPTION OF THE DRAWINGS

The present invention will now be more particularly described by way of example only with reference to the accompanying drawings, in which.

The present invention will now be more particularly described by way of example only with reference to the accompanying drawings, in which.

DETAILED DESCRIPTION

As described above, the present inventors have developed an improved memory unit and method for implementing word line boost that addresses the challenge of applying this boost in an effective way through merging the word line decoding function and the boost function. This is achieved by applying a boost or assist voltage as one of the input signals to a driver circuit that provides a decoding function, and FIG. 7 illustrates schematically an example of a memory unit suitable for implementing this method of word line boost.

Figure 7:
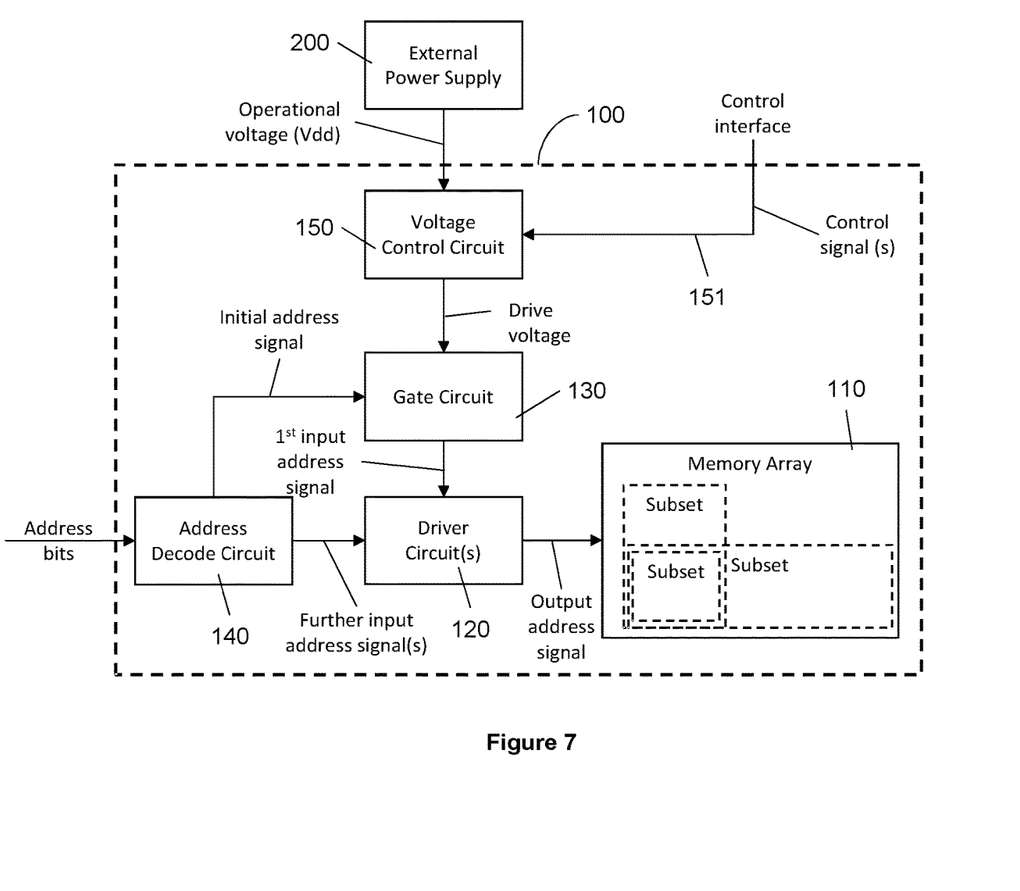
FIG. 7 illustrates schematically an example of a memory unit as described herein.

FIG. 7 illustrates a memory unit 100 comprising an array of memory cells 100 and at least one driver circuit 120. The driver circuit 120 is configured to output an output address signal that addresses a portion/subset of the array of memory cells 110. In order to implement the method of providing a boosted voltage described herein the driver circuit 120 comprises a logic gate that is configured to receive one or more input address signals and to provide an output address signal in dependence upon the one or more input address signals. The logic gate is then configured to output a drive voltage provided by a first of the one or more input address signals as the output address signal when the output of the logic gate is true/high. The drive voltage provided by the first input address signal can then be a boost or assist voltage that is useful in enabling improved write and read operations.

In a preferred embodiment, the logic gate comprises an inverter configured to receive the first input address signal as a supply voltage, to receive a second input address signal as an input, and to output the first input address signal in dependence upon the second input address signal. The inverter is therefore configured to operate as an AND gate as it effectively performs an AND function on the first and second input address signals. In this embodiment, the second input address signal would therefore need to be an inverted version of an address signal. The driver circuit 120 could therefore further comprise a further inverter that is configured conventionally in order to invert an incoming address signal, with this inverted address signal then being provided to the logic gate as the second input address signal. Alternatively, the address signal could be inverted elsewhere within the memory unit 100 prior to being provided to the driver circuit 120 as the second input address signal.

Where the logic gate comprises an inverter, the inverter could comprise one or more field effect transistors (FET) with the first input address signal being provided to a source of a first of the one or more field effect transistors. In particular, the logic gate could comprise a CMOS inverter that is configured to receive the first input address signal as a supply voltage, to receive the second address signal as an input, and to output the drive voltage provided by the first input address signal as the output address signal in dependence upon the second address signal.

Figure 8:
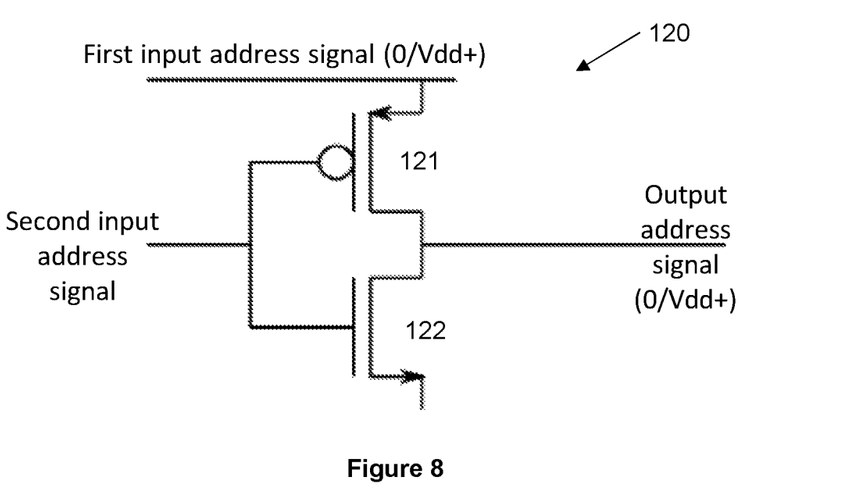
FIG. 8 illustrates an example of a driver circuit suitable for use in the memory unit as described herein.

FIG. 8 illustrates an example of a driver circuit 120 that consists of such a CMOS inverter, wherein the driver circuit comprises a PMOS transistor 121 and an NMOS transistor 122 having a circuit topology that corresponds to that of a conventional CMOS inverter. In the example of FIG. 8, the source of the PMOS transistor is configured to receive the first input address signal, the gate of the PMOS transistor is configured to receive the second input address signal, and the drain of the PMOS transistor is connected to an output of the driver circuit and to the drain of the NMOS transistor. The source of the NMOS transistor is connected to ground/a negative supply voltage, the gate of the NMOS transistor is configured to receive the second input address signal, and the drain of the NMOS transistor is connected to the output of the driver circuit.

The memory unit 100 shown in FIG. 7 can further comprise a voltage control circuit 150 that is configured to provide the drive voltage used for the first input address signal of the one or more input address signals. In particular, the voltage control circuit 150 is configured to provide a drive voltage that is equal to, greater than or less than a voltage provided to the memory unit 100 by an external power supply 200. In this regard, the voltage provided to the memory unit 100 by an external power supply 200 will be the operational voltage (Vdd) used by the memory unit 100 wherein this operational voltage is that which is usually supplied to various circuit elements that make up the memory unit 100. However, in this example, the voltage control circuit 150 is provided so that a 'boosted' drive voltage (Vdd+) that differs from the supply voltage can be supplied to the driver circuit(s) 120 as and when required. By way of example, the voltage control circuit 150 could provide the 'boosted' drive voltage (Vdd+) internally using capacitive coupling.

Preferably, the voltage control circuit 150 comprises a control interface 151 for receiving control signals that defines a value for the drive voltage. The value defined by the control signal will be equal to, greater than or less than a voltage (Vdd) provided to the memory unit by an external power supply. In this regard, when the memory unit is used in a system-on-a-chip (SoC) environment, there will typically be a power controller which adjusts operating voltage levels in various parts of a system in order to save power. Whilst the reduced operating voltages would normally be incompatible with memory operation, the memory unit described herein provides a means to allow the memory to continue operation even with a reduced supply, as the power controller can determine a value for the boost/assist voltage depending on whether/how much the supply that the memory is deployed on has been reduced.

The advantage of the circuits and methods described herein is that it enables operation over a wider range of overall voltage without imposing specific demands based on the needs of the memory unit (which are generally more restrictive), thus allowing more flexibility in the SoC power optimisation. Furthermore, the circuits and methods described herein also provide that the use of a boosted/assist voltage can be enabled or disabled, and the level of any boosted/assist voltage chosen, by the power controller depending upon the operating conditions (e.g. Vdd, temperature, corner etc.), depending upon the operation being performed, and could even be used to selectively enhance specific words having weak memory cells. Moreover, the desired level of the boost/assist could be either positive or negative (i.e. either greater than or less than a voltage provided to the memory unit by an external power supply), with a negative boost/reduced drive voltage being particularly useful to avoid read disturbs.

In the example of FIG. 7, the memory unit 100 further comprises a gate circuit 130 that is configured to provide the first input address signal to a driver circuit 120. The gate circuit 130 comprises a further logic gate that is configured to receive an initial address signal and to output the first input address signal in dependence upon the initial address signal, and wherein the drive voltage is provided to the further logic gate as a supply voltage and is output as the first input address signal when the output of the further logic gate is true/high. The gate circuit 130 is therefore provided in order to generate an address signal-dependent drive voltage that is used as the first input address signal. In particular, the gate circuit 130 functions so as to combine the drive voltage (that may be a boost/assist voltage provided by the voltage control circuit 150, as shown in FIG. 7) to be used by the driver circuit(s) 120 with an address signal.

In a preferred embodiment, the further logic gate may comprise an inverter that is configured to receive the drive voltage as a supply voltage, to receive an initial address signal as an input, and to output the drive voltage as the first input address signal in dependence upon the address signal. In this embodiment, the initial address signal would therefore need to be an inverted version of an address signal. The gate circuit 130 could therefore further comprise a further inverter that is configured conventionally in order to invert an incoming address signal, with this inverted address signal then being provided to the further logic gate as the initial address signal. Alternatively, the address signal could be inverted elsewhere within the memory unit 100 prior to being provided to the gate circuit 130 as the initial address signal.

Where the further logic gate comprises an inverter, the inverter could comprise one or more field effect transistors (FET) with the drive voltage being provided to a source of a first of the one or more field effect transistors. In particular, the further logic gate could comprise a CMOS inverter that is configured to receive the drive voltage as a supply voltage, to receive the initial address signal as an input, and to output the drive voltage as the first input address signal in dependence upon the address signal.

Figure 9:
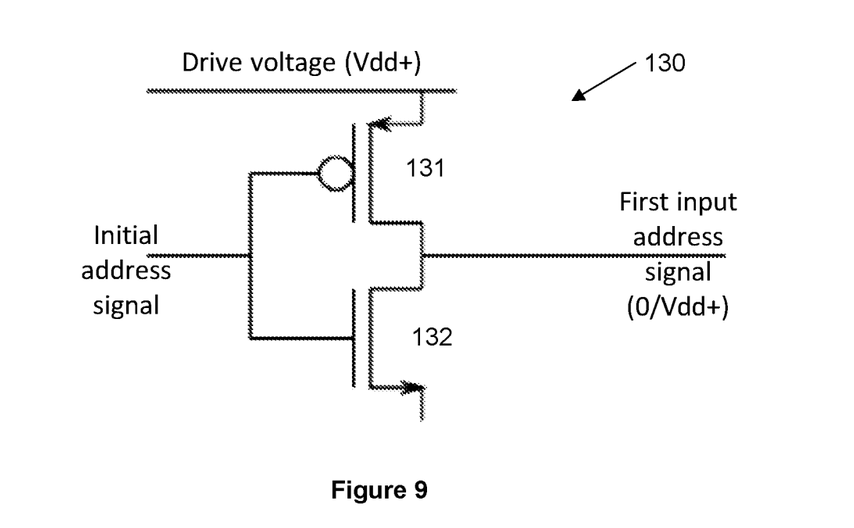
FIG. 9 illustrates an example of a voltage supply circuit suitable for use in the memory unit as described herein.

FIG. 9 illustrates an example of a gate circuit 130 that consists of such a CMOS inverter, wherein the gate circuit comprises a PMOS transistor 131 and an NMOS transistor 132 having a circuit topology that corresponds to that of a conventional CMOS inverter. In the example of FIG. 9, the source of the PMOS transistor is configured to receive the drive voltage, the gate of the PMOS transistor is configured to receive the initial address signal, and the drain of the PMOS transistor is connected to an output of the gate circuit and to the drain of the NMOS transistor. The source of the NMOS transistor is connected to ground/a negative supply voltage, the gate of the NMOS transistor is configured to receive the initial address signal, and the drain of the NMOS transistor is connected to the output of the gate circuit.

Figure 10:
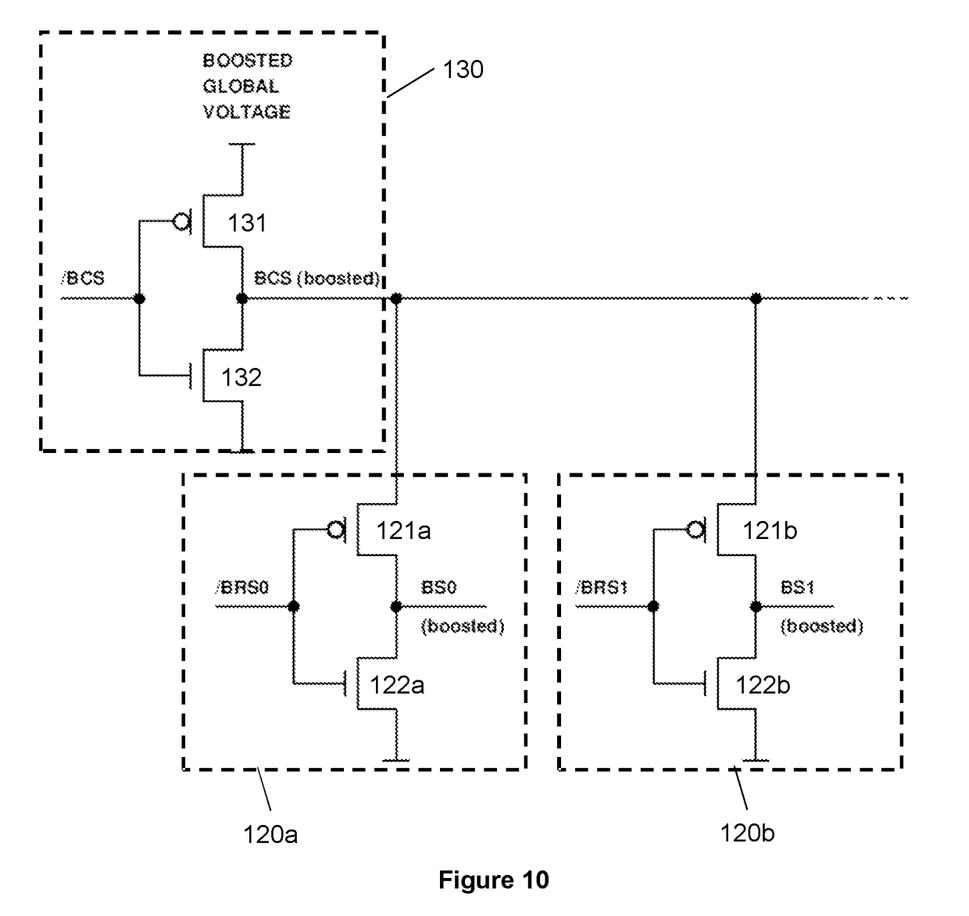
FIG. 10 illustrates an example of a voltage supply circuit combined with a sequence of driver circuits suitable for use in the memory unit as described herein.

FIG. 10 illustrates an example of a gate circuit 130 combined in sequence with a number of driver circuits 120a, 120b. In this example, the gate circuit 130 receives a 'boosted' drive voltage as the supply voltage at the source of the PMOS transistor 131 and combines that with an initial address signal that is received as an input so as to generate a 'boosted', address signal-dependent drive voltage. In this example, the initial address signal received as an input is an inverted block column select (/BCS) signal that results in the output of a block column select (BCS) signal that when high/true provides the 'boosted' voltage. The output of the gate circuit 130 is then provided to two separate driver circuits 120a, 120b as the first input address signal as the supply voltage at the source of the PMOS transistors 121a, 121b.

The first of the driver circuits 120a also receives a second input address signal as an input and combines this with the 'boosted' first input address signal so as to generate an output address signal that when high/true provides the 'boosted' voltage. In this example, the first input address signal is the 'boosted' block column select (BCS) signal and the second input address signal is an inverted first block row select signal (/BRS0) that results in the output of a first block select (BS0) signal (i.e. activateBlock signal) that when high/true provides the 'boosted' voltage.

Correspondingly, the second of the driver circuits 120b receives a second input address signal as an input and combines this with the 'boosted' first input address signal so as to generate an output address signal that when high/true provides the 'boosted' voltage. In this example, the first input address signal is the 'boosted' block column select (BCS) signal and the second input address signal is an inverted second block row select signal (/BRS0) that results in the output of a second block select (BS1) signal (i.e. activateBlock signal) that when high/true provides the 'boosted' voltage.

Figure 11:
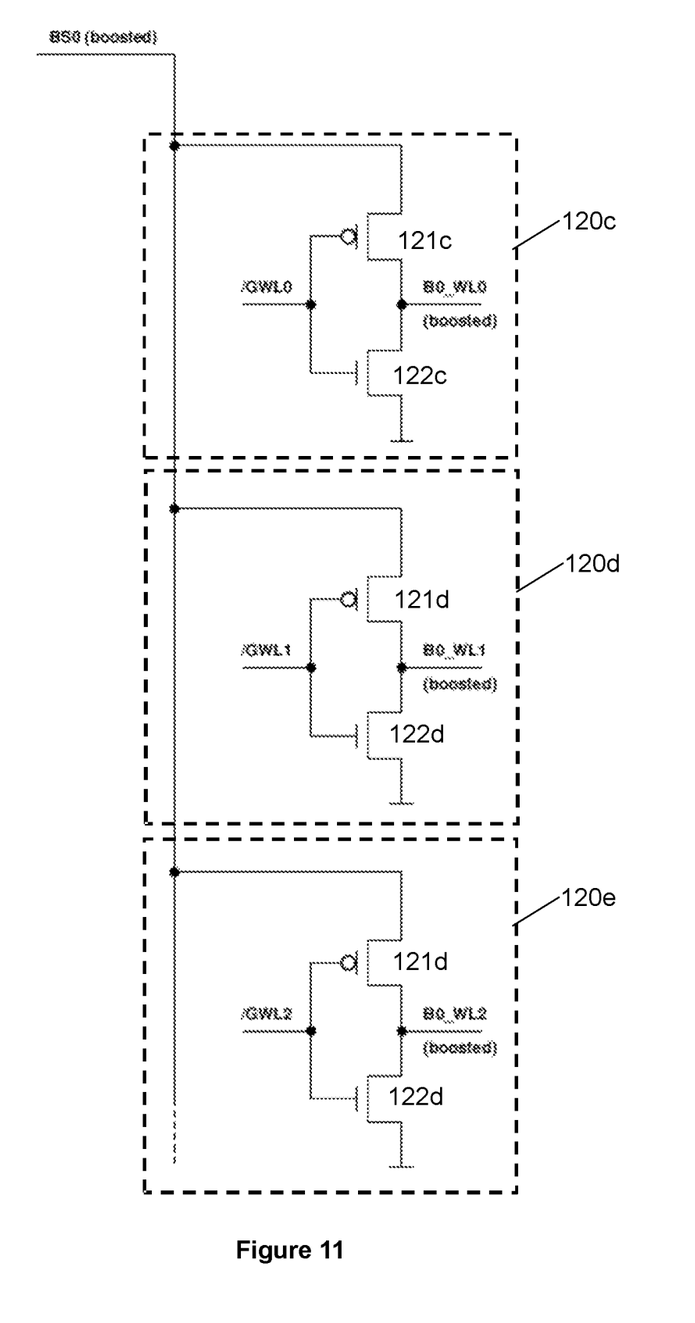
FIG. 11 illustrates an example of the driver circuit as described herein as word line drivers in a memory unit that comprises hierarchical word lines.

FIG. 11 then illustrates an example of a number of further driver circuits 120c, 120d, 120e that are connected in sequence with the first driver circuit 120a of FIG. 10. In this example, the output of the first driver circuit 120a shown in FIG. 10 is provided to three further driver circuits 120c, 120d, 120e as the 'boosted' first input address signal at the source of their PMOS transistors 121c, 121d, 121e. Each of these further driver circuits 120c, 120d, 120e then also receives a second input address signal as an input and combines this with the 'boosted' first input address signal so as to generate an output address signal that when high/true provides the 'boosted' voltage. In this example, the first input address signal is the 'boosted' block select (BS0)

signal and each of the second input address signals are inverted global word line signals (/GWL0, /GWL1, /GWL2 respectively) that results in the output of a local word line signal (BS0_WL0, BS0_WL1, BS0_WL2) signal that when high/true provides the 'boosted' voltage. The driver circuits 120c, 120d, 120e are therefore local word line driver circuits that provide the 'boosted' voltage to the gate of the access transistors of the memory cells that comprise a selected word.

The driver circuit 120 can therefore configured to output the output address signal on to a word line of the array (i.e. is configured to operate as a word line driver). Furthermore, in a memory array that makes use of a hierarchical word line arrangement, the driver circuit can be configured to receive a global word line signal as a second input address signal and to output the drive voltage provided by the first input address signal as the output address signal (i.e. as a local word line signal) when the output of the logic gate is true/high.

In the example of FIG. 7, the memory unit 100 also comprises an address decode circuit 140 configured to decode an address (i.e. a plurality of address bits) and thereby generate one or more address signals that each addresses a different portion/subset of the array of memory cells. The address signals generated by the address decode circuit 140 will then be provided to the driver circuit(s) 120 and the gate circuit 130. For example, the one or more input address signals provided to the driver circuit(s) 120 could each address any of a column of the array, a row of the array, a block of the array, a block column of the array, a block row of the array, and a global word line of the array 110. The output address signal provided by the driver circuit(s) 120 could then address any of a column of the array, a row of the array, a block of the array, a block column of the array, a block row of the array, a global word line of the array and a local word line of the array 110.

It will be appreciated that individual items described above may be used on their own or in combination with other items shown in the drawings or described in the description and that items mentioned in the same passage as each other or the same drawing as each other need not be used in combination with each other. In addition, any reference to "comprising" or "consisting" is not intended to be limiting in any way whatsoever and the reader should interpret the description and claims accordingly. Furthermore, although the invention has been described in terms of preferred embodiments as set forth above, it should be understood that these embodiments are illustrative only.

Those skilled in the art will be able to make modifications and alternatives in view of the disclosure which are contemplated as falling within the scope of the appended claims. For example, those skilled in the art will appreciate that the above-described invention might be equally applicable to other types of memory.

The invention claimed is:

1. A memory unit comprising:
an array of memory cells;
a driver circuit configured to output an output address signal that addresses a portion/subset of the array of memory cells; and
wherein the driver circuit comprises a logic gate that is configured to receive one or more input address signals and to provide an output address signal in dependence upon the one or more input address signals, and wherein the logic gate is configured to output a drive voltage provided by a first of the one or more input address signals as the output address signal when the output of the logic gate is true/high;
a gate circuit configured to provide a first input address signal to the driver circuit;
wherein the gate circuit comprises a further logic gate that is configured to receive an initial address signal and to output the first input address signal in dependence upon the initial address signal; and
wherein the drive voltage is provided to the further logic gate as a supply voltage and is output as the first input address signal when the output of the further logic gate is true/high.

2. The memory unit according to claim 1, and further comprising a voltage control circuit configured to provide the drive voltage used for the first input address signal of the one or more input address signals, wherein the drive voltage provided by the voltage control circuit is equal to, greater than or less than a voltage provided to the memory unit by an external power supply.

3. The memory unit according to claim 2, wherein the voltage control circuit comprises a control interface for receiving control signals that defines a value for the drive voltage, the value defined by the control signal being equal to, greater than or less than a voltage provided to the memory unit by an external power supply.

4. The memory unit according to claim 1, wherein the logic gate comprises an inverter configured to receive a second input address signal as an input, and to output the first input address signal in dependence upon the second input address signal.

5. The memory unit according to claim 4, wherein the first input address signal is provided to the inverter as a supply voltage.

6. The memory unit according to claim 5, wherein the inverter comprises one or more field effect transistors (FET) with the first input address signal being provided to a source of a first of the one or more field effect transistors.

7. The memory unit according to claim 4, wherein the logic gate comprises a CMOS inverter that is configured to receive the first input address signal as a supply voltage, to receive the second address signal as an input, and to output the drive voltage provided by the first input address signal as the output address signal in dependence upon the second address signal.

8. A memory unit according to claim 7, wherein the logic gate comprises a PMOS transistor and an NMOS transistor, a source of the PMOS transistor being configured to receive the first input address signal, a gate of the PMOS transistor being connected to the second address signal, and a drain of the PMOS transistor being connected to an output of the driver circuit; and a source of the NMOS transistor being connected to ground/a negative supply voltage, a gate of the NMOS transistor being connected to the second address signal, and a drain of the NMOS transistor being connected to the output of the driver circuit.

9. A memory unit according to claim 4, wherein the driver circuit consists of the inverter.

10. A memory unit according to claim 1, wherein the (activation/selection) one or more input address signals (activates/selects) each address any of a column of the array, a row of the array, a block of the array, a block column of the array, a block row of the array, and a global word line of the array.

11. A memory unit according to claim 1, wherein the (activation/selection) output address signal (activates/selects) addresses any of a column of the array, a row of the array, a block of the array, a block column of the array, a block row of the array, a global word line of the array and a local word line of the array.

12. A memory unit according to claim 1, wherein the driver circuit is configured to output the output address signal on to a word line of the array (i.e. is configured to operate as a word line driver).

13. A memory unit according claim 1, wherein the memory cells are grouped into a plurality of memory cell groups, a memory cell group being associated with a local word line that is operatively connected to a corresponding global word line via the driver circuit, the driver circuit being configured to receive a global word line signal as a second input address signal and to output the drive voltage provided by the first input address signals as the output address signal when the output of the logic gate is selected/true/high.

14. The memory unit according to claim 1, wherein the further logic gate comprises a CMOS inverter that is configured to receive the drive voltage as a supply voltage, to receive the address signal as an input, and to output the drive voltage as the first input address signal in dependence upon the address signal.

15. A memory unit according to claim 14, wherein the logic gate comprises a PMOS transistor and an NMOS transistor, a source of the PMOS transistor being configured to receive the drive voltage, a gate of the PMOS transistor being connected to the address signal, and a drain of the PMOS transistor being connected to an output of the gate circuit; and a source of the NMOS transistor being connected to ground/a negative supply voltage, a gate of the NMOS transistor being connected to the address signal, and a drain of the NMOS transistor being connected to the output of the gate circuit.

16. A memory unit according to claim 1, and further comprising a sequence of two or more driver circuits, wherein the output address signal produced by a preceding driver circuit is provided to an immediately subsequent driver circuit as the first input address signal.

17. A method of operating a memory unit comprising an array of memory cells, the method comprising:
   providing one or more input address signals to a driver circuit, a first of the one or more input address signals providing a drive voltage;
   the driver circuit providing an output address signal in dependence upon the one or more input address signals, wherein the logic gate outputs the drive voltage provided by the first input address signal as the output address signal when the output of the logic gate is true/high;
wherein a gate circuit provides a first input address signal to the driver circuit; wherein the gate circuit comprises a further logic gate that receives an initial address signal and outputs the first address signal in dependence upon the initial address signal; and wherein the drive voltage is provided to the further logic gate as a supply voltage and is output as the first input address signal when the output of the further logic gate is true/high.

18. The method according to claim 17, and further comprising
   generating the drive voltage used for the first input address signal, wherein the drive voltage is equal to, greater than or less than a voltage provided to the memory unit by an external power supply.

19. The method according to claim 18, and further comprising:
   receiving a control signal that defines a value for the drive voltage, the value defined by the control signal being equal to, greater than or less than a voltage provided to the memory unit by an external power supply.

20. The method according to claim 17, wherein the drive voltage is generated by a voltage control circuit, and preferably wherein the voltage control circuit comprises a control interface for receiving control signals that define a value for the drive voltage, the value defined by the control signal being equal to, greater than or less than a voltage provided to the memory unit by an external power supply.

21. A method of operating a memory unit comprising an array of memory cells, the method comprising:
   at a voltage control circuit of the memory unit, receiving control signals that define an amount/value of a drive voltage that is equal to, greater than or less than a voltage provided to the memory unit by an external power supply;
   at the voltage control circuit of the memory unit, generating the drive voltage in accordance with the control signals and providing the drive voltage for use as a first input address signal; and
   at the driver circuit of the memory unit, receiving the first input address signal and one or more further input address signals, and providing an output address signal in dependence upon the input address signals;
   wherein the driver circuit outputs the drive voltage provided by the first input address signal as the output address signal when the output of the logic gate is true/high;
   wherein a gate circuit provides a first input address signal to the driver circuit; wherein the gate circuit comprises a further logic gate that receives an initial address signal and outputs the first address signal in dependence upon the initial address signal; and wherein the drive voltage is provided to the further logic gate as a supply voltage and is output as the first input address signal when the output of the further logic gate is true/high.

* * * * *